(12) United States Patent
Lee

(10) Patent No.: US 10,358,596 B2
(45) Date of Patent: Jul. 23, 2019

(54) ORGANIC FLUORESCENT MATERIAL AND LIGHT-SOURCE MODULE

(71) Applicant: HANNSTAR DISPLAY CORPORATION, Taipei (TW)

(72) Inventor: Jiun-Haw Lee, Taipei (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 139 days.

(21) Appl. No.: 15/365,960

(22) Filed: Dec. 1, 2016

(65) Prior Publication Data

US 2018/0100100 A1 Apr. 12, 2018

(30) Foreign Application Priority Data

Oct. 8, 2016 (CN) .......................... 2016 1 0875766

(51) Int. Cl.
| | |
|---|---|
| *C09K 11/06* | (2006.01) |
| *F21V 8/00* | (2006.01) |
| *G02F 1/1335* | (2006.01) |
| *H01L 27/32* | (2006.01) |
| *H01L 51/00* | (2006.01) |

(52) U.S. Cl.
CPC ............ *C09K 11/06* (2013.01); *G02B 6/0003* (2013.01); *G02B 6/005* (2013.01); *G02F 1/133514* (2013.01); *H01L 27/322* (2013.01); *H01L 51/0054* (2013.01); *C09K 2211/1011* (2013.01); *G02F 2001/133614* (2013.01); *Y10T 428/10* (2015.01)

(58) Field of Classification Search
CPC . C09K 11/06; C09K 2211/1011; B82Y 20/00; G02B 6/0003; G02B 6/0011; G02B 6/005; H01L 27/322; H01L 27/3225; H01L 51/0054
USPC ................. 428/1.1, 402, 690, 917; 436/172; 977/773, 788; 257/88, 89
See application file for complete search history.

(56) References Cited

FOREIGN PATENT DOCUMENTS

CN 103151469 A * 6/2013 ............. H01L 51/52

OTHER PUBLICATIONS

Kim et al, "Tuning photoluminescence of organic rubrene nanoparticles", 2011, Nanoscle Research Letters, V6 (405).*

* cited by examiner

*Primary Examiner* — Ruiyun Zhang
(74) *Attorney, Agent, or Firm* — Winston Hsu

(57) ABSTRACT

A fluorescent material includes at least one organic compound with molecular stacking of H-aggregate or J-aggregate. When a first color light illuminates the fluorescent material, the organic compound with molecular stacking of H-aggregate or J-aggregate converts the first color light to a second color light.

15 Claims, 8 Drawing Sheets

ORGANIC FLUORESCENT MATERIAL AND LIGHT-SOURCE MODULE

BACKGROUND OF THE INVENTION

1. Field of the Invention

The present invention relates to a fluorescent material, and more particularly, to a fluorescent material including an organic compound with molecular stacking of H-aggregate or J-aggregate having a narrow full width at half maximum (FWHM) of emission spectrum, so as to supply a light-source with higher color purity.

2. Description of the Prior Art

Recently, the liquid crystal display device including light-source, such as the light-emitting diode (LED), for supplying light and a liquid crystal panel for generating images has been developed well and used extensively. It is designed that the backlight module of the liquid crystal display device emits white light having a wide wavelength range of the emission spectrum, then, the color filter in each pixel unit would filter the white light to the three primary lights, red light, green light, and blue light, and the liquid crystal component would control the light intensity of each pixel unit respectively, so as to display the images.

Nowadays, the main stream of the light-source of the display panel utilizes the blue LED with the yttrium aluminum garnet (YAG) yellow fluorescent powder to emit white light. However, the full width at half maximum (FWHM) of the emission spectrum of this white light is wide, and this white light would contains more intermediate color light. Thus, the liquid crystal display device utilized the above-mentioned light source has worse performance of the color tone, such that the color purity needs to be improved.

SUMMARY OF THE INVENTION

In order to improve the color purity of the light emitted from the display device, the present invention provides a light-source module utilized a fluorescent material including an organic compound with molecular stacking of H-aggregate or J-aggregate, and the emission spectrum of the organic compound with molecular stacking of H-aggregate or J-aggregate has a narrow full width at half maximum (FWHM), so as a light-source with higher color purity can be supplied.

One of the objectives of the present invention is to provide a light-source module that includes a light-emitting component and a fluorescent material. The light-emitting component is utilized for providing a first color light. The fluorescent material includes at least one organic compound with molecular stacking of H-aggregate or J-aggregate, wherein when the first color light illuminates the fluorescent material, the organic compound with molecular stacking of H-aggregate or J-aggregate converts the first color light to a second color light.

Another objective of the present invention is to provide a fluorescent material that includes at least one organic compound with molecular stacking of H-aggregate or J-aggregate. The FWHM of the emission spectrum of the organic compound with molecular stacking of H-aggregate or J-aggregate is about 25-50 nanometers (nm).

Still another objective of the present invention is to provide a display panel that includes a first substrate, a second substrate, a display medium layer, a switch component layer and an above-mentioned light-source module. The second substrate is disposed correspondingly to the first substrate. The display medium layer is disposed between the first substrate and the second substrate. The switch component layer is disposed on a first surface of the second substrate and between the second substrate and the display medium layer. The above-mentioned light-source module is disposed adjacent to a second surface of the second substrate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, numerals of the elements are marked in the accompanying drawings to be apart of them, and the embodiments that may be practiced are illustrated as specific examples for explaining the present invention. These embodiments are described in sufficient detail to enable those skilled in the art to practice them, and it is to be understood that other embodiments may be utilized and the structural, logical and electrical changes may be made without departing from the main spirit of the described embodiments. The following detailed description is, therefore, not to be taken in a limiting sense, and the main spirit and included embodiments of the present invention are defined by the appended claims.

In the following detailed description of the present invention, the term "full width at half maximum (FWHM)" indicates that the full width between the two points at the half of the maximum of the waveform peak of the absorption spectrum or the emission spectrum. This value can be measured by the ultraviolet/visible-light spectrometer, and express the color purity of each color tone of the final emission spectrum. In the present invention, the description of "to improve color tone" may indicate or include the method of selectively absorbing the intermediate color light that influences the visual performance of the original light. For example, the performance of the color purity of the red light can be improved by filtering out the light with wavelength close to the yellow light of intermediate color.

Figure 1:
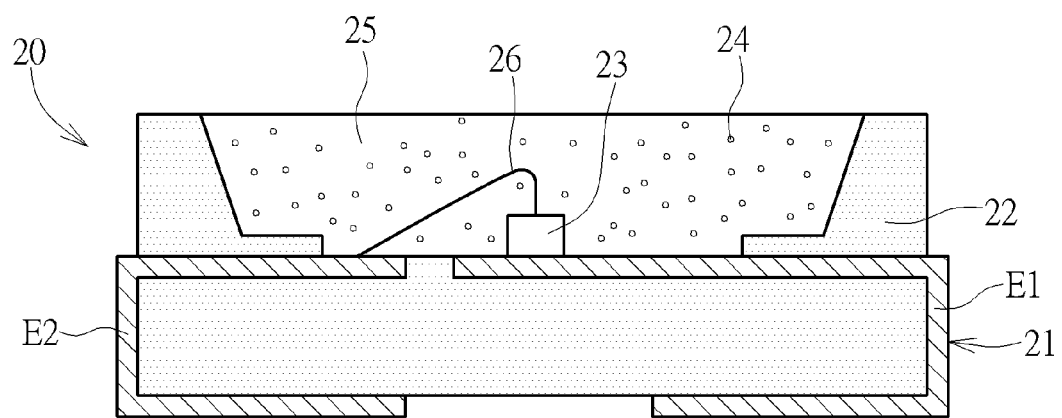
FIG. 1 is a schematic sectional diagram of alight-source module according to a first embodiment of the present invention.

Please refer to FIG. 1, and FIG. 1 is a schematic sectional diagram of a light-source module according to a first embodiment of the present invention. In this embodiment, the light-source module 20 is a light-emitting diode (LED) package structure including a lead frame 21, a package housing 22, a light-emitting component 23, a lead wire 26 and a transparent material 25. The lead frame 21 has a first electrode E1 and a second electrode E2 which are disposed separately. The package housing 22 has a calathiform structure disposed on the lead frame 21. The light-emitting component 23 is an ultraviolet/blue light-emitting diode (UV/blue-LED) chip as an example, and is disposed in the containing space of the calathiform structure of the package housing 22. The light-emitting component 23 and the first electrode E1 are electrically connected to the second electrode E2 in the lead frame 21 through the lead wire 26. In the condition of charging, the light-emitting component 23 would be excited to emit a first color light. The first color light in this embodiment is blue light, but not limited thereto. The package housing 22 is filled with the transparent material 25. Preferably, the transparent material 25 is epoxy resin with anti-ultraviolet/anti-blue light property, such as cycloaliphatic epoxy. The transparent material 25 is mixed with a fluorescent material 24. The fluorescent material 24 in this embodiment would absorb the first color light emitted from the light-emitting component 23 and convert it to a second color light, such as convert the blue light to yellow light, such that the mixture of the first color light and the second color light produces white light. Therefore, in this embodiment, the density of the fluorescent material 24 is required to be high enough to ensure that a specific portion of the first color light can be converted to the second color light and mix with the first color light, such that the light emitted from the light-source module 20 is white light.

The conventional white-LED package structure utilizes the blue-LED being the light-source with the yttrium aluminum garnet (YAG) yellow fluorescent powder for emitting white light. However, as mentioned in the section of background of the invention, the white light emitted from the conventional white-LED package structure would contain the stray light or unexpected deviated to the intermediate color, so the (FWHM) of its emission spectrum is wide. Comparatively, according to the present invention, when some of the fluorescent materials are fabricated as J-aggregate or H-aggregate, the FWHM of the emission spectrum of the fluorescent material would be narrow significantly, and therefore the color purity of the light-source can be improved. The J-aggregate is a one-dimensional structure of which a plurality of dye molecules are aggregated, perpendicular to the direction of the transition moment (the direction of head to end) and the deviation angle between the dye molecules is very small. The H-aggregate is a structure of face-to-face stack. The properties of the J-aggregate dye and the H-aggregate dye are that the bandwidth of their visible-light would deviate toward the short bandwidth, and the deviation range is from 30 nanometers (nm) to 60 nanometers (nm). Compared with single molecule, the J-aggregate and the H-aggregate have narrow FWHM value, such as less than 50 nm.

In the embodiment of the present invention, the fluorescent material preferably includes at least one organic compound with molecular stacking of J-aggregate or H-aggregate selected from the chemical groups having a structure expressed by formula (1), but not limited thereto.

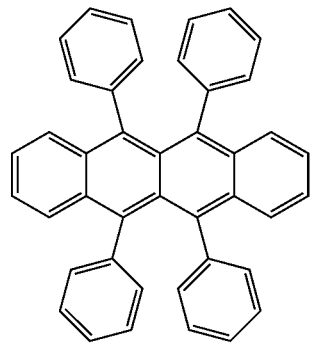

Formula (1)

Formula (1) is Rubrene (5,6,11,12-Tetraphenylnaphthacene) molecule, which is a kind of red polycyclic aromatic hydrocarbon (PAH) material and has a high fluorescent quantum effect to emit strong fluorescence. The light emitted from the Rubrene ranges from the yellow light to the orange light, and that is suitable for collocating with the blue-LED to produce white light. Thus, the light-source module of this embodiment can serve as a white-LED package structure that emits white light.

Figure 2:
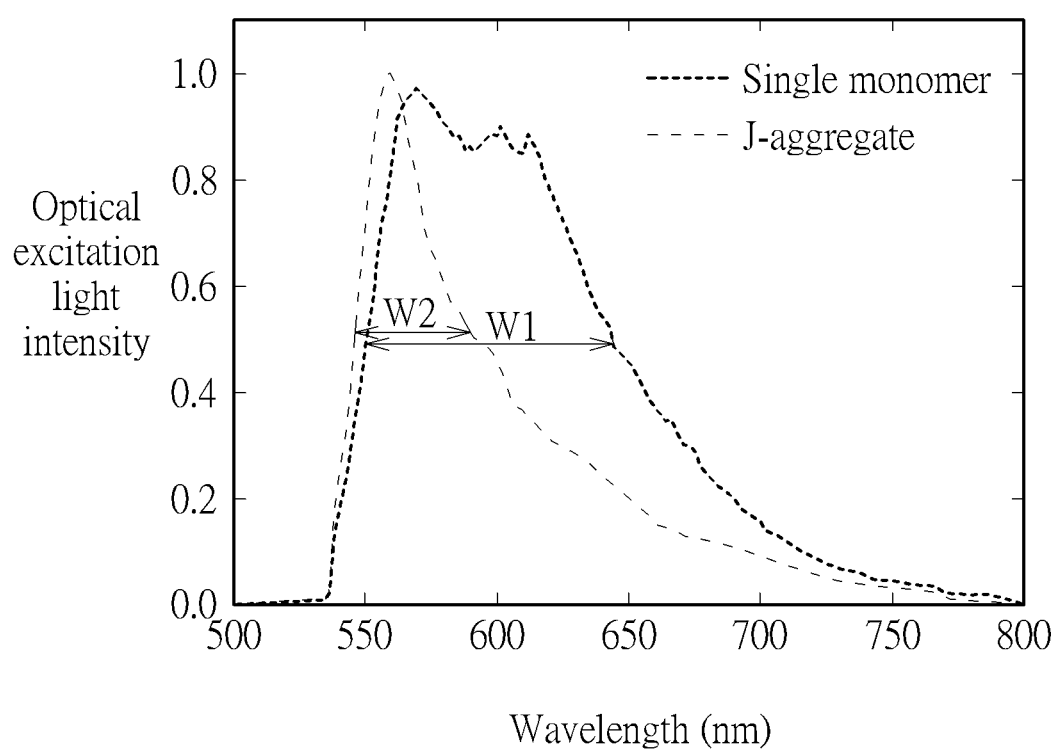
FIG. 2 is an emission spectrum diagram of Rubrene material according to the first embodiment of the present invention.

Please refer to FIG. 2, and FIG. 2 is an emission spectrum diagram of Rubrene of the fluorescent material according to the first embodiment of the present invention, wherein the Rubrene with molecular stacking of J-aggregate is utilized in the first embodiment for example. As shown in FIG. 2, the FWHM W1 of the Rubrene material in the condition of single monomer type is approximately 100 nm. Comparatively, when the Rubrene molecules is formed to become J-aggregate structure, the FWHM W2 decreases to about 40 nm, and the peak wavelength falls between 535 nm and 585 nm (the range from the minimum wavelength to the maximum wavelength at half maximum). That is to say, the light emitted from the Rubrene molecules with molecular stacking of J-aggregate by optical excitation have higher color purity, and the intermediate color stray light mixed in the light is less. Similarly, the Rubrene molecules with molecular stacking of H-aggregate also have the same property, of which the FWHM of the emission spectrum is narrower than the single monomer type significantly, so as to improve the color purity of the light-source. Therefore, according to the present invention, the FWHM of the emission spectrum of the organic compound with molecular stacking of H-aggregate or J-aggregate which is suitable for the fluorescent material 24 preferably is about 25-50 nm.

Figure 3:
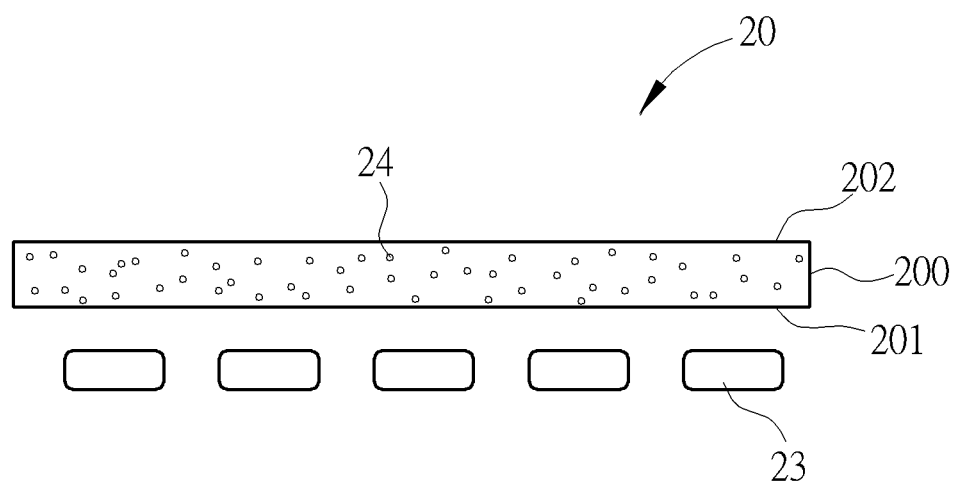
FIG. 3 is a schematic sectional diagram of a light-source module according to a second embodiment of the present invention.

Besides the LED package structure shown in FIG. 1, the fluorescent material of the present invention can also be applied to a backlight module of a display panel. Please refer to FIG. 3, and FIG. 3 is a schematic sectional diagram of a light-source module according to a second embodiment of the present invention. In this embodiment, the light-source module 20 is a backlight module of a display panel, such as a liquid crystal display panel. The backlight module includes, but not limited to, a plurality of light-emitting components 23 and a light guide plate 200, wherein the light guide plate 200 utilizes the total reflection theory for making the light emitted from the light-source diffuse uniformly. The light guide plate 200 includes a light-entering surface 201 and a light-exiting surface 202 which are disposed correspondingly and parallelly. The light-emitting components 23 are disposed adjacent to the light-entering surface 201 of the light guide plate 200, and the fluorescent material 24 is disposed in the light guide plate 200. Accordingly, when the first color light emitted from the light-emitting components 23 goes through the light guide plate 200, a portion of the first color light can be converted to the second color light by the fluorescent material 24, and the first color light and the second color light can be diffused and fully mix in the light guide plate 200, so that the light emitted from the light-exiting surface 202 is the mixture of the first color light and the second color light. According to this embodiment, the mixture of the first color light and the second color light preferably produce white light, and therefore the light emitted from the light guide plate 200 is white light. In variant embodiments, the design of the relative position of the light-exiting surface 202 and the light-entering surface 201 of the light guide plate 200 may be different. For example, the light-entering surface 201 may be situated at the lateral side and connected to the light-exiting surface 202 perpendicularly, thus, the light-emitting components 23 are preferably disposed at the lateral side of the light guide plate 200 and adjacent to the light-entering surface 201. In addition, in further variant embodiments, the fluorescent material 24 may be disposed adjacent to the light-exiting surface 202 of the light guide plate 200, not distributing uniformly in the light guide plate 200. Furthermore, the light-source module 20 may further include one or more optical films disposed on the light-entering surface 201 or the light-exiting surface 202 of the light guide plate 200, such as a brightness enhancement film or alight guide film. Also, the light-source module 20 may further include a reflective film disposed on a side of the light-emitting components 23 opposite to the light guide plate 200.

Figure 4:
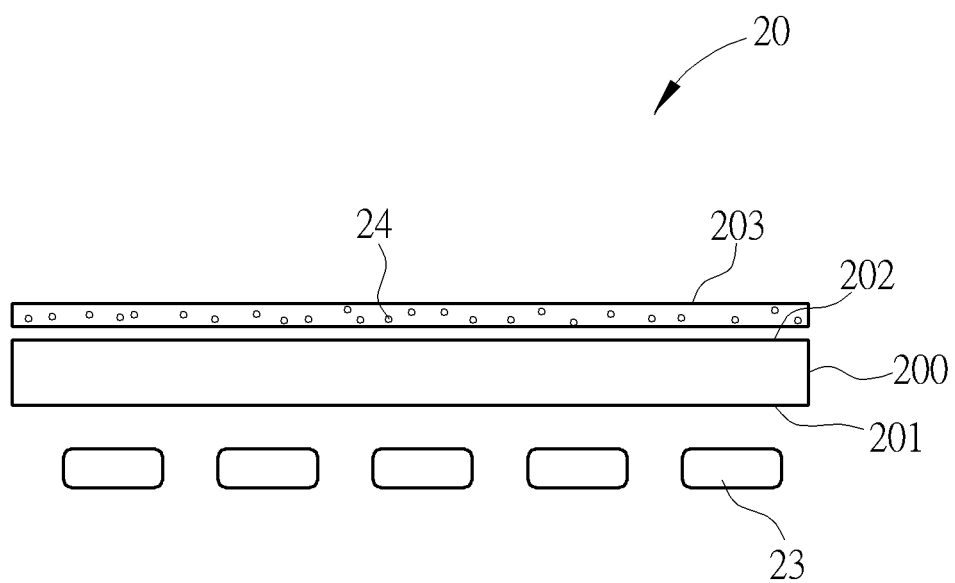
FIG. 4 is a schematic sectional diagram of a light-source module according to a variant embodiment of the second embodiment of the present invention.

In another variant embodiment of the second embodiment, as shown in FIG. 4, the light-source module 20 may further include a light-adjusting film 203 disposed on the light-exiting surface 202. The fluorescent material 24 is disposed in the light-adjusting film 203, and not disposed in the light guide plate 200, such that the portion of the first color light emitted from the light-emitting components 23 goes through the light guide plate 200 to diffuse uniformly and emits from the light-exiting surface 202, and then, enters the light-adjusting film 203 to be converted to the second color light by the fluorescent material 24 disposed in the light-adjusting film 203. Thus, the light emitted from the light-adjusting film 203 can include a mixture of the first color light and the second color light, so as to produce white light. Preferably, the thickness of the fluorescent material 24 disposed in the light-adjusting film 203 is less than 300 nm, so as to avoid the blue light being converted to yellow light completely, which cannot produce the mixture of white light. The advantage of this variant embodiment is that the normal light guide plate 200 used in the conventional backlight module may be directly utilized in the light-source module 20, while the light-adjusting film 203 having the fluorescent material 24 of the present invention is further disposed on the light guide plate 200, so as to make the backlight module produce the white light with high purity.

Figure 5:
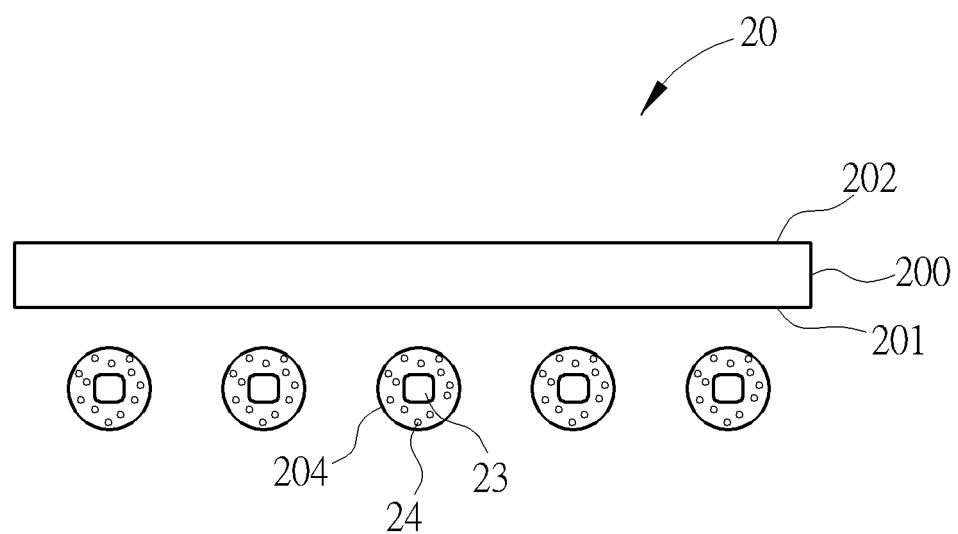
FIG. 5 is a schematic sectional diagram of a light-source module according to a third embodiment of the present invention.

As shown in FIG. 5, the difference between the light-source module of the third embodiment and the second embodiment is that the light-source module 20 further includes a light guide pipe 204 or a plurality of light guide pipes 204 disposed adjacent to the light-entering surface 201 of the light guide plate 200 in the third embodiment, wherein the light guide pipe 204 is disposed between each light-emitting component 23 and the light guide plate 200, and the fluorescent material 24 is disposed in each light guide pipe 204 dispersedly. According to this embodiment, the light guide pipes 204 have cylinder shapes, and each light-emitting component 23 is disposed in one light guide pipe 204 and encased by the light guide pipe 204. Therefore, when the first color light emitted from the light-emitting components 23 illuminates the fluorescent material 24 disposed in the light guide pipes 204, the fluorescent material 24 would convert the first color light to the second color light, such that the light emitted from the light guide pipes 204 includes the white light mixed by the first color light and the second color light. In this way, the light would be converted to the white light before entering the light guide plate 200, and then be diffused uniformly by the light guide plate 200.

Figure 6:
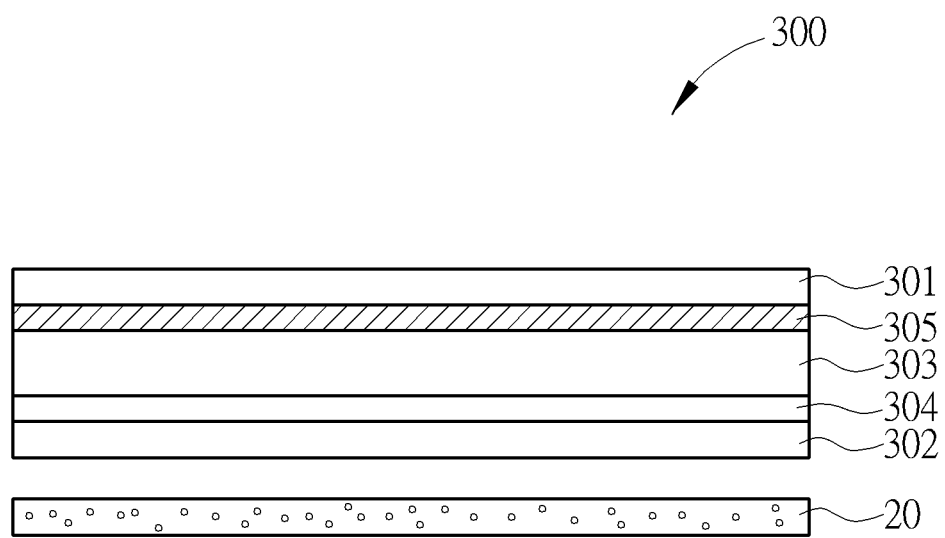
FIG. 6 is a schematic sectional diagram of a display panel according to an embodiment of the present invention.
Figure 7:
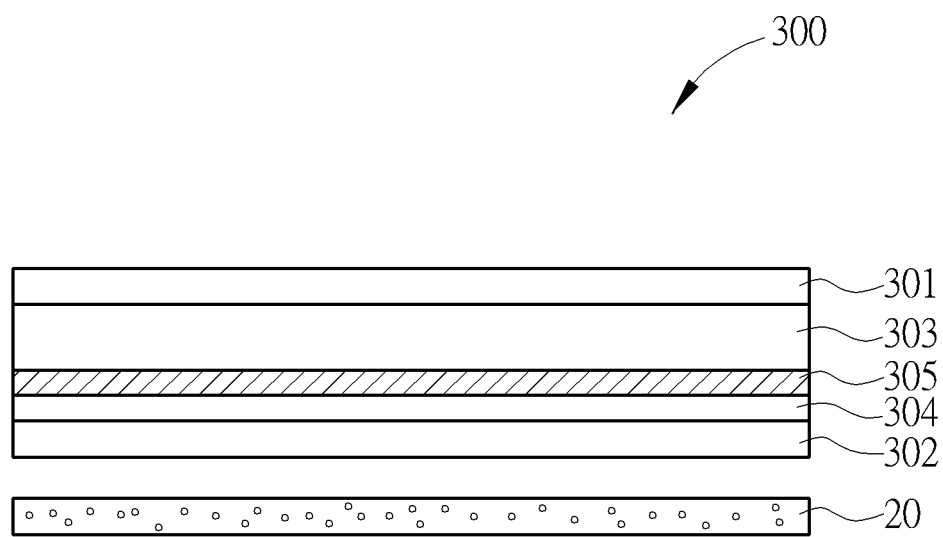
FIG. 7 is a schematic sectional diagram of a display panel according to another embodiment of the present invention.
Figure 8:
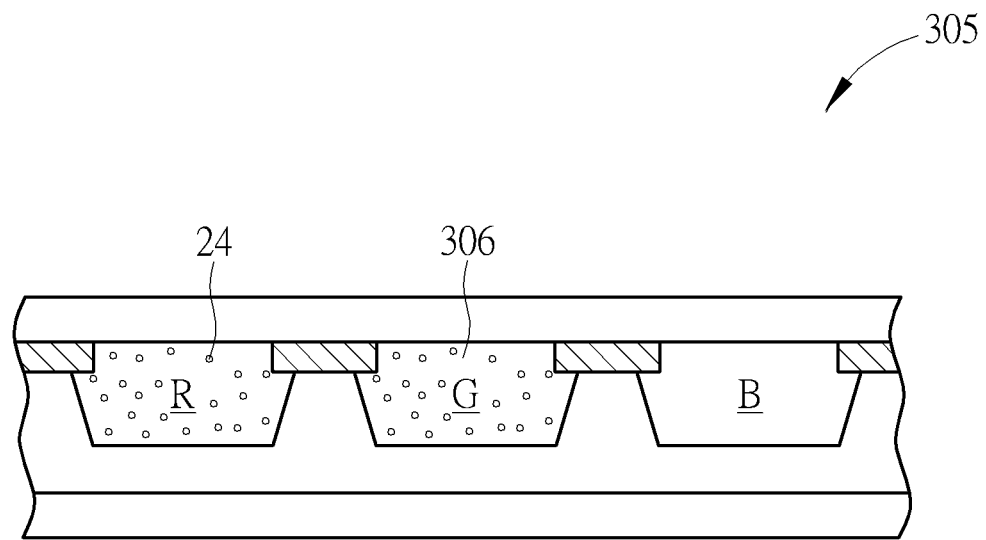
FIG. 8 is a schematic sectional diagram of a color-filtering layer of a display panel according to a further embodiment of the present invention.

The light-source module of the present invention is suitable for being used in many kinds of display devices, such as liquid crystal display panel (LCD), so as to provide the color light with high color purity and wide color gamut. Please refer to FIG. 6, and FIG. 6 is a schematic sectional diagram of a display panel 300 assembled with the light-source module of the present invention. As shown in FIG. 6, the display panel 300 includes a first substrate 301, a second substrate 302, a display medium layer 303, a switch component layer 304 and a light-source module 20. The second substrate 302 and the first substrate 301 are disposed correspondingly. The display medium layer 303 is disposed between the first substrate 301 and the second substrate 302 and is, but not limited to, an organic light-emitting material layer or a liquid crystal layer. The switch component layer 304 is disposed on a surface of the second substrate 302 and between the second substrate 302 and the display medium layer 303. The display panel 300 of this embodiment may further include a color-filtering layer 305 disposed on a surface of the first substrate 301 and between the first substrate 301 and the display medium layer 303. In addition, the light-source module 20 of this embodiment is disposed on a surface of the second substrate 302, wherein the light-source module 20 is the light-source module or the backlight module aforementioned in the second embodiment, the third embodiment or the variant embodiments. In another embodiment, as shown in FIG. 7, the color-filtering layer 305 may be disposed between the switch component layer 304 and the display medium layer 303. Furthermore, in still another embodiment, as shown in FIG. 8, the fluorescent material 24 of the present invention may be used in the sub pixels 306 of the color-filtering layer 305 directly. The fluorescent material selected for using in each of the sub pixels 306 would be different based on the color of the backlight. For example, in the condition of the blue backlight (the backlight producing blue light) is used, the fluorescent material 24 that produces red light is used in the red sub pixels R, the fluorescent material 24 that produces green light is used in the green sub pixels G, and no fluorescent material 24 is needed in the blue sub pixels B. In this way, in the red sub pixels R and green sub pixels G, the fluorescent material 24 can convert the blue backlight to the red light or the green light respectively. The color-filter layer 305 of this embodiment does not use the dying photoresist or other conventional color filter material, but uses specific fluorescent materials 24 for producing different color lights, so as to avoid the absorption and consumption of the backlight. In addition, in order to prevent the red light or the green light, produced by the fluorescent material 24 and converted from the blue backlight, from mixing with the blue light emitted by the blue backlight, the thickness of the fluorescent material 24 disposed in the color-filtering layer 305 of each sub pixel 306 is preferably greater than 300 nm, such that the fluorescent material 24 would convert the blue backlight to the red light or the green light completely in the color-filtering layer 305.

Furthermore, in this embodiment, the light-source module 20 may be other kinds of backlight modules. The light-source module 20 is not limited to panel type shown in the figures. The other detailed features of the display panel are the conventional technology in this field, so this part will not be redundantly described.

In conclusion, the present invention utilizes a fluorescent material including an organic compound with molecular stacking of H-aggregate or J-aggregate for a light-source module, and the FWHM of the emission spectrum of the fluorescent material is about 25-50 nm. Therefore, when the first color light emitted from the light-emitting component is converted to the second color light by the fluorescent material, the second color light has wavelength concentrated in a narrow range and has higher color purity. According to this design, the white light produced by mixing the first color light and the second color light converted from the first color light has higher color purity. As a result, when the light-source module of the present invention is utilized for the backlight module of the display panel, the color gamut of the display panel would be promoted, so as to improve the color performance of the whole image.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-source module, comprising:
a light-emitting component for providing a first color light; and
a fluorescent material comprising at least one organic compound with molecular stacking of H-aggregate or J-aggregate, wherein when the first color light illuminates the fluorescent material, the organic compound with molecular stacking of H-aggregate or J-aggregate converts at least a portion of the first color light to a second color light, and a full width at half maximum (FWHM) of an emission spectrum of the organic compound with molecular stacking of H-aggregate or J-aggregate is in a range from 25 to 50 nm.

2. The light-source module of claim 1, wherein a mixture of the first color light and the second color light produces white light.

3. The light-source module of claim 1, wherein the light-emitting component is a blue light-emitting diode.

4. The light-source module of claim 3, wherein the organic compound comprises Rubrene.

5. The light-source module of claim 3, wherein a peak wavelength of an emission spectrum of the organic compound with molecular stacking of H-aggregate or J-aggregate is between 535 nanometers (nm) and 585 nanometers (nm).

6. The light-source module of claim 1, wherein the fluorescent material and the light-emitting component are assembled to form to an organic light-emitting diode package structure.

7. The light-source module of claim 1, further comprising a light guide plate, wherein the light guide plate comprises a light-entering surface and a light-exiting surface, the light-emitting component is disposed adjacent to the light-entering surface, and the fluorescent material is disposed in the light guide plate.

8. The light-source module of claim 7, wherein the fluorescent material is disposed adjacent to the light-exiting surface.

9. The light-source module of claim 1, further comprising a light guide plate and a light-adjusting film, wherein the light guide plate comprises a light-entering surface and a light-exiting surface, the light-emitting component is disposed adjacent to the light-entering surface, the light-adjusting film is disposed on the light-exiting surface, and the fluorescent material is disposed in the light-adjusting film.

10. The light-source module of claim 9, wherein a thickness of the fluorescent material disposed in the light-adjusting film is less than 300 nm.

11. The light-source module of claim 1, further comprising a light guide plate and a light guide pipe, wherein the light guide plate comprises a light-entering surface and a light-exiting surface, the light-emitting component is disposed adjacent to the light-entering surface, the light guide pipe is disposed between the light-emitting component and the light guide plate, and the fluorescent material is disposed in the light guide pipe.

12. A display panel, comprising:
a first substrate;
a second substrate disposed correspondingly to the first substrate;
a display medium layer disposed between the first substrate and the second substrate;
a switch component layer disposed on a first surface of the second substrate and between the second substrate and the display medium layer; and
the light-source module according to claim 1 disposed adjacent to a second surface of the second substrate.

13. The display panel of claim 12, further comprising a color-filtering layer disposed between the switch component layer and the display medium layer.

14. The display panel of claim 12, further comprising a color-filtering layer disposed on a surface of the first substrate and between the first substrate and the display medium layer.

15. The display panel of claim 12, wherein the display medium layer is an organic light-emitting material layer or a liquid crystal layer.

* * * * *